United States Patent
Lee et al.

(10) Patent No.: US 9,396,796 B2
(45) Date of Patent: *Jul. 19, 2016

(54) MEMORY SYSTEM INCLUDING NONVOLATILE MEMORY DEVICES WHICH CONTAIN MULTIPLE PAGE BUFFERS AND CONTROL LOGIC THEREIN THAT SUPPORT VARYING READ VOLTAGE LEVEL TEST OPERATIONS

(71) Applicant: Samsung Electronics Co., Ltd., Suwon-si (KR)

(72) Inventors: Sang Hoon Lee, Yongin-si (KR); Hyun Seok Kim, Goyang-si (KR); Sung-Hwan Bae, Seoul (KR); Jong-Nam Baek, Hwaseong-si (KR); Jae Yong Jeong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 23 days.

This patent is subject to a terminal disclaimer.

(21) Appl. No.: 14/525,768

(22) Filed: Oct. 28, 2014

(65) Prior Publication Data

US 2015/0070997 A1    Mar. 12, 2015

Related U.S. Application Data

(63) Continuation of application No. 13/618,604, filed on Sep. 14, 2012, now Pat. No. 8,885,409.

(30) Foreign Application Priority Data

Nov. 24, 2011  (KR) .................. 10-2011-0123847

(51) Int. Cl.
- *G11C 7/00* (2006.01)
- *G11C 16/04* (2006.01)
- *G11C 16/06* (2006.01)
- *G11C 16/26* (2006.01)
- *G11C 29/00* (2006.01)

(52) U.S. Cl.
CPC ............ *G11C 16/04* (2013.01); *G11C 16/0483* (2013.01); *G11C 16/06* (2013.01); *G11C 16/26* (2013.01); *G11C 29/00* (2013.01)

(58) Field of Classification Search
USPC .............................................. 365/185.12, 201
See application file for complete search history.

(56) References Cited

U.S. PATENT DOCUMENTS 7,299,400 B2    11/2007    Yusa
7,362,623 B2    4/2008    Honma et al.
(Continued)

FOREIGN PATENT DOCUMENTS

JP    2005-242797    9/2005
KR    10-2008-0022496 A    3/2008

*Primary Examiner* — Hoai V Ho
(74) *Attorney, Agent, or Firm* — Myers Bigel & Sibley, P.A.

(57) ABSTRACT

A nonvolatile memory device includes an array of nonvolatile memory cells and a plurality of page buffers configured to receive a plurality of pages of data read from the same page in the array using different read voltage conditions. A control circuit is provided, which is electrically coupled to the plurality of page buffers. The control circuit is configured to perform a test operation by driving the plurality of page buffers with control signals that cause generation within the nonvolatile memory device of a string of XOR data bits, which are derived from a comparison of at least two of the multiple pages of data read from the same page of nonvolatile memory cells using the different read voltage conditions. An input/output device is provided, which is configured to output test data derived from the string of XOR data bits to another device located external to the nonvolatile memory device.

11 Claims, 11 Drawing Sheets

(56) References Cited

U.S. PATENT DOCUMENTS

| | | |
|---|---|---|
| 7,518,931 B2 | 4/2009 | Shim |
| 7,581,153 B2 | 8/2009 | Micheloni et al. |
| 8,885,409 B2 * | 11/2014 | Lee .................. G11C 16/0483 365/185.1 |
| 2013/0070524 A1 | 3/2013 | Dutta et al. .............. 365/185.03 |

* cited by examiner

FIG. 3B

|      | [0] | [1] | [2] | [3] | [4] | [5] | [6] | [7] |
|------|-----|-----|-----|-----|-----|-----|-----|-----|
| PD1  | 1   | 0   | 0   | 1   | 1   | 1   | 0   | 1   |
| PD2  | 0   | 1   | 0   | 1   | 0   | 1   | 0   | 1   |
| PD2' | 1   | 0   | 0   | 1   | 1   | 1   | 0   | 1   |
| PY_R | 0   | 0   | 0   | 0   | 0   | 0   | 0   | 0   |
| PY_PD1 | 0 | 1   | 1   | 0   | 0   | 0   | 1   | 0   |
| PY_PD2 | 1 | 1   | 1   | 0   | 1   | 0   | 1   | 0   |
| PY   | 1   | 1   | 0   | 0   | 1   | 0   | 0   | 0   |

FIG. 4

|  | [0] | [1] | [2] | [3] | [4] | [5] | [6] | [7] |
|---|---|---|---|---|---|---|---|---|
| PD1 | 0 | 0 | 0 | 0 | 1 | 1 | 1 | 1 |
| PD2 | 0 | 0 | 0 | 0 | 1 | 1 | 1 | 1 |
| PY_R | 0 | 0 | 0 | 0 | 0 | 0 | 0 | 0 |
| PY_PD1 | 1 | 1 | 1 | 1 | 0 | 0 | 0 | 0 |
| PY_PD2 | 1 | 1 | 1 | 1 | 0 | 0 | 0 | 0 |
| PY | 0 | 0 | 0 | 0 | 0 | 0 | 0 | 0 |

MEMORY SYSTEM INCLUDING NONVOLATILE MEMORY DEVICES WHICH CONTAIN MULTIPLE PAGE BUFFERS AND CONTROL LOGIC THEREIN THAT SUPPORT VARYING READ VOLTAGE LEVEL TEST OPERATIONS

REFERENCE TO PRIORITY APPLICATION

This U.S. non-provisional patent application is a continuation of U.S. patent application Ser. No. 13/618,604, filed Sep. 14, 2012, which claims priority to Korean Patent Application No. 10-2011-0123847, filed Nov. 24, 2011, the disclosure of which is hereby incorporated herein by reference in its entirety.

FIELD

This invention relates to integrated circuit memories and, more particularly, to non-volatile memories and methods of testing reliability of nonvolatile memories.

BACKGROUND

NAND flash memory devices are non-volatile memory devices. When the distribution of threshold voltages of NAND memory cells included in a NAND flash memory device is measured, a page is read multiple times. The data bits of the page read under different read operations are compared with each other, and the variation of distributions is measured using the comparison result. Such comparison and measurement is performed by a memory controller that controls the operation of the NAND flash memory device. For instance, the memory controller requires two sets of buffers for storing data read in two read operations, respectively, and an XOR logic circuit for comparing data output from the two sets of buffers bit by bit. However, due to time taken to read data from the NAND flash memory device in two read operations, to transmit the data to the memory controller and to perform a bit-wise XOR operation on the data, it takes long time for the memory controller to measure the variation of the data.

SUMMARY

A nonvolatile memory device according to embodiments of the invention includes an array of nonvolatile memory cells and a plurality of page buffers in the read/write path of the nonvolatile memory device. The plurality of page buffers are configured to receive a corresponding plurality of pages of data read from the same page of nonvolatile memory cells in the array using different read voltage conditions for each of the plurality of pages of data being read. A control circuit is also provided, which is electrically coupled to the plurality of page buffers. The control circuit is configured to perform a test operation by driving the plurality of page buffers with control signals that cause generation within the nonvolatile memory device of a string of XOR data bits, which are derived from a comparison of at least two of the multiple pages of data read from the same page of nonvolatile memory cells using the different read voltage conditions. An input/ output device is also provided, which is configured to output test data derived from the string of XOR data bits to another device located external to the nonvolatile memory device. According to some of these embodiments of the invention, the input/output device is configured to output the test data to a flash memory controller. This test data may be the string of XOR data bits or a count of a number of asserted bits in the string of XOR data bits.

A nonvolatile memory device according to additional embodiments of the invention includes an array of nonvolatile memory cells and a plurality of page buffers configured to receive a corresponding plurality of pages of data read from a first page of nonvolatile memory cells in the array using different read voltage conditions for each of the plurality of pages of data being read. A control circuit is also provided, which is electrically coupled to the plurality of page buffers. The control circuit is configured to detect excessive threshold-voltage spreading in the first page of nonvolatile memory cells by driving the plurality of page buffers with control signals that cause a bit-by-bit comparison between at least two of the multiple pages of data read from the first page of nonvolatile memory cells using the different read voltage conditions. An input/output device is provided, which is configured to output test data derived from the bit-by-bit comparison to a memory controller located external to the nonvolatile memory device. This test data may include a string of XOR data bits and/or a count of a number of a number of asserted XOR data bits generated from the bit-by-bit comparison.

According to some additional embodiments of the inventive concept, there is provided a method of operating a nonvolatile memory. The method includes the operations of storing first data, which is read from a target page using a first read voltage level, in a first page buffer; storing second data, which is read from the target page using a second read voltage level, in a second page buffer; and changing third data in a third page buffer using at least part of the first data transferred from the first page buffer and at least part of the second data transferred from the second page buffer to generate data, which is the same as bit-wise XOR data with respect to the first data and the second data. The first data may be transferred to the first page buffer through the third page buffer, and the second data may be transferred to the second page buffer through the third page buffer.

When the at least part of the first data is a first group of bits, which are included in the first data and have a first value, and the at least part of the second data is a second group of bits, which are included in the second data and have the first value, the operation of changing the third data may include (a) initializing each value of bits included in the third data to the first value; (b) changing each value of bits corresponding to the first group among bits included in the third data, which has been initialized in operation (a), to a second value; (c) changing each value of bits corresponding to the second group among bits included in the third data, which has been changed in operation (b), to the second value; and (d) changing each value of common bits among bits included in the third data, which has been changed in operation (c), to the first value. Each of the common bits may be a bit corresponding to bits that have the first value at the same position in both of the first group and the second group. The first value may be one of "0" and "1" and the second value may be the other one of the "0" and the "1".

The method may further include performing a bit-wise XOR operation on reference data and the data that is the same as the bit-wise XOR data using an XOR logic circuit; and counting the number of bits having a particular value in data output from the XOR logic circuit and outputting a count value to a controller, using a counter.

According to other embodiments of the inventive concept, there is provided a method of operating a memory system, which includes a non-volatile memory and a controller controlling an operation of the non-volatile memory. The method includes the operations of the non-volatile memory storing first data, which is read from a target page using a first read voltage level, in a first page buffer during a first read operation; the non-volatile memory storing second data, which is read from the target page using a second read voltage level, in a second page buffer during a second read operation; and the non-volatile memory changing third data in a third page buffer using at least part of the first data transferred from the first page buffer and at least part of the second data transferred from the second page buffer to generate data, which is the same as bit-wise logic operation data with respect to the first data and the second data during a test mode operation. The bit-wise logic operation data may be bit-wise XOR data or bit-wise exclusive NOR data.

The method may further include the controller transmitting a first read voltage level change command for setting the first read voltage level and a first read command for controlling the first read operation to the non-volatile memory; and the controller transmitting a second read voltage level change command for setting the second read voltage level and a second read command for controlling the second read operation to the non-volatile memory.

When the at least part of the first data is a first group of bits, which are included in the first data and have a first value, and the at least part of the second data is a second group of bits, which are included in the second data and have the first value, The operation of changing the third data may include (a) initializing each value of bits included in the third data to the first value; (b) changing each value of bits corresponding to the first group among bits included in the third data, which has been initialized in operation (a), to a second value; (c) changing each value of bits corresponding to the second group among bits included in the third data, which has been changed in operation (b), to the second value; and (d) changing each value of common bits among bits included in the third data, which has been changed in operation (c), to the first value. Each of the common bits may be a bit corresponding to bits that have the first value at the same position in both of the first group and the second group. The non-volatile memory may sequentially perform operations (a) through (d) in response to a single test mode command, which is output from the controller to control the test mode operation. Alternatively, the non-volatile memory may perform operations (a) through (d) in response to test mode commands, respectively, which are sequentially output from the controller to control the test mode operation.

The method may further include transmitting the data that is the same as the bit-wise logic operation data to the controller; and counting the number of bits having a particular value in the data that is the same as the bit-wise logic operation data and generating a count value, using a counter. Alternatively, the method may further include performing a bit-wise XOR operation on reference data and the data that is the same as the bit-wise XOR data using an XOR logic circuit included in the non-volatile memory; and counting the number of bits having a particular value in data output from the XOR logic circuit and outputting a count value to the controller, using a counter included in the non-volatile memory. The reference data may be transmitted from the controller. The non-volatile memory may be a NAND flash memory.

BRIEF DESCRIPTION OF THE DRAWINGS

The above and other features and advantages of the inventive concept will become more apparent by describing in detail exemplary embodiments thereof with reference to the attached drawings in which:

FIG. 3B is a diagram showing a result of bit-wise XOR operation using the transfer of data stored in page buffers according to other embodiments of the inventive concept;

FIG. 4 is a diagram showing a result of bit-wise XOR operation using the transfer of data stored in page buffers according to further embodiments of the inventive concept;

DETAILED DESCRIPTION

Figure 1:
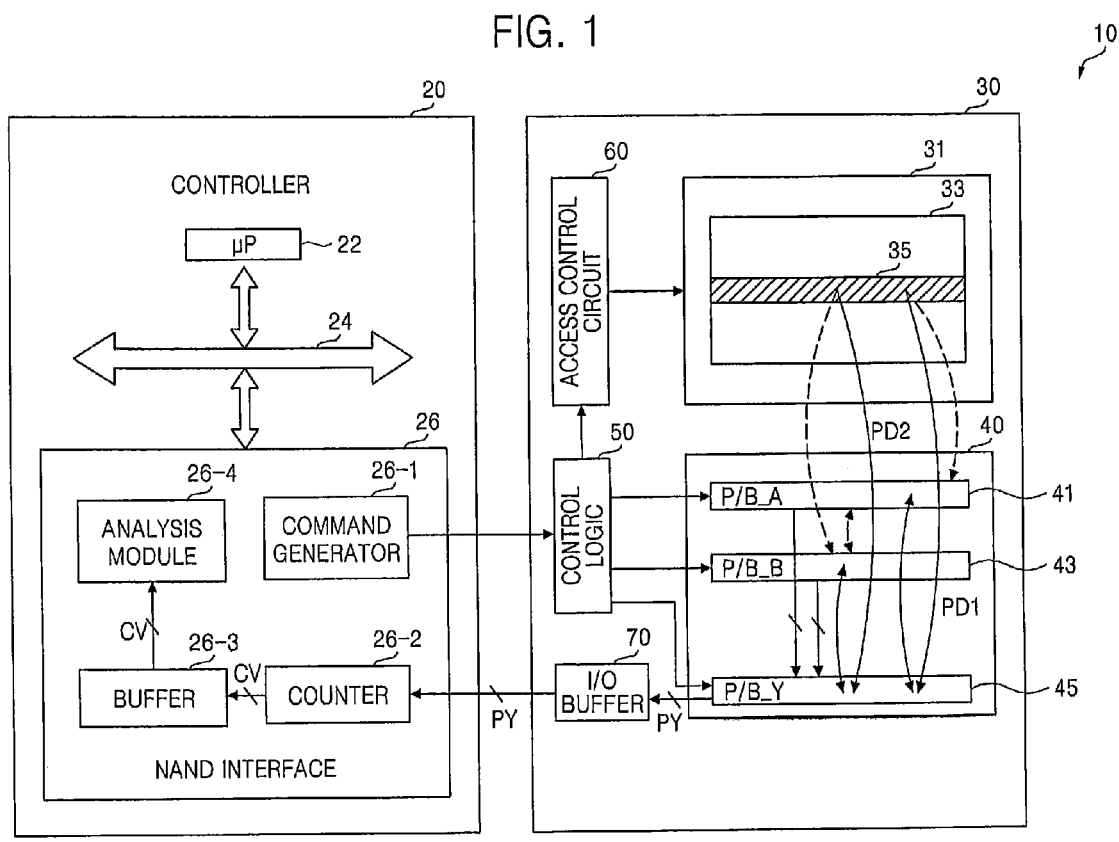
FIG. 1 is a block diagram of a memory system according to some embodiments of the inventive concept.

The present inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a memory system 10 according to some embodiments of the inventive concept. The memory system 10 includes a controller 20 and a non-volatile memory 30. The memory system 10 may be implemented as a personal computer (PC), a laptop computer, computing system, or a hand held portable device. The portable device may be a mobile phone, a cellular phone, a smart phone, a tablet PC, a personal digital assistant (PDA), a portable multimedia player (PMP), an MP3 player, an MP4 player, or an e-book, for example. The controller 20 controls the operation of the non-volatile memory 30. The controller 20 includes a microprocessor 22, a bus 24, and a non-volatile memory interface 26. The microprocessor 22 controls the overall operation of the controller 20. The microprocessor 22 may communicate commands and/or data with the non-volatile memory interface 26 through the bus 24. The non-volatile memory interface 26 may communicate commands and/or data with the non-volatile memory 30 under the control of the microprocessor 22.

When the non-volatile memory 30 is implemented by a NAND flash memory, the non-volatile memory interface 26 may be implemented by a NAND interface appropriate to communicate commands and/or data with the NAND flash memory. The non-volatile memory 30 may be implemented by a two-dimensional or three-dimensional NAND flash memory.

The non-volatile memory interface 26 includes a command generator 26-1, a counter 26-2, a buffer 26-3, and an analysis module 26-4. The command generator 26-1 generates a command for controlling the operation, e.g., the program operation, the read operation or the erase operation, of the non-volatile memory 30 according to the control of the microprocessor 22. Accordingly, the non-volatile memory 30 may perform the program operation in response to a program command, the read operation in response to a read command, or the erase operation in response to an erase command. The command generator 26-1 may also generate a read voltage level change command and a test mode command. Accordingly, the non-volatile memory 30 may change a read voltage level for the read operation in response to the read voltage level change command or may transmit at least part of data from each of page buffers 41 and 43 to a page buffer 45, to which the controller 20 can access, in response to the test mode command. The counter 26-2 counts the number of bits, which is included in data, e.g., bit-wise XOR data, PY transmitted from the non-volatile memory 30 and which has a particular value (e.g., one between 0 and 1); and generates a count value CV. The buffer 26-3 may store the count value CV received from the counter 26-2. The analysis module 26-4 may analyze the count value CV received from the buffer 26-3 and transmit an analysis result to the microprocessor 22 or a host (not shown) that controls the controller 20. The buffer 26-3 may be implemented by static random access memory (SRAM). The analysis module 26-4 or the microprocessor 22 may measure or calculate a distribution of memory cells included in a page or a distribution of memory cells included in the non-volatile memory 30 using the count value CV received from the buffer 26-3.

The non-volatile memory 30 includes a memory cell array 31, a page buffer block 40, a control logic 50, an access control circuit 60, and an input/output (I/O) buffer 70. The memory cell array 31 includes a plurality of blocks including a first block 33. Each of the blocks includes a plurality of pages. Each of the pages includes a plurality of non-volatile memory cells, e.g., NAND memory cells. For clarity of the description, only one block 31 is illustrated in FIG. 1. Each of the NAND memory cells may be a single-level cell (SLC) that stores one bit or a multi-level cell (MLC) that stores two or more bits. When the non-volatile memory 30 is implemented by NAND flash memory, the program operation and the read operation may be performed in units of pages and the erase operation may be performed in units of blocks. The page buffer block 40 may temporarily store data to be programmed to the memory cell array 31 in the program operation and may sense and amplify data in the read operation. Accordingly, the page buffer block 40 may be referred to as a data register and sense amplifier block.

The page buffer block 40 includes a plurality of the page buffers 41, 43, and 45. Each of the page buffers 41, 43, and 45 includes a plurality of latches (not shown). Each of the latches may be replaced with a data register. Each of the data latches may transmit a bit while sensing and amplifying another bit. In addition, each of the data latches may read a bit while sensing and amplifying another bit. A data latch included in each of the page buffers 41, 43, and 45 may latch and output data or inverted data in response to at least one control signal output from the control logic 50. The page buffers 41, 43, and 45 may communicate data with each other according to the control of the control logic 50.

For instance, when data "1" is latched by a data latch, the data latch may output the data "1" as it is or inverted data, i.e., data "0" in response to a control signal output from the control logic 50. When data "0" is latched by a data latch, the data latch may output the data "0" as it is or inverted data, i.e., data "1" in response to a control signal output from the control logic 50.

The control logic 50 may control the operation of the page buffer block 40 and the access control circuit 60 in response to a command, e.g., the read voltage level change command, the read command, the test mode command, the program command, or the erase command, output from the controller 20. According to the control of the control logic 50, the access control circuit 60 may control the page buffer block 40 and the I/O buffer 70 to program data output from the controller 20 to a target page 35 of the first block 33 of the memory cell array 31 in the program operation. In addition, according to the control of the control logic 50, the access control circuit 60 may control the page buffer block 40 and the I/O buffer 70 to transmit data read from the target page 35 of the first block 33 of the memory cell array 31 to the controller 20 in the read operation.

Figure 2:
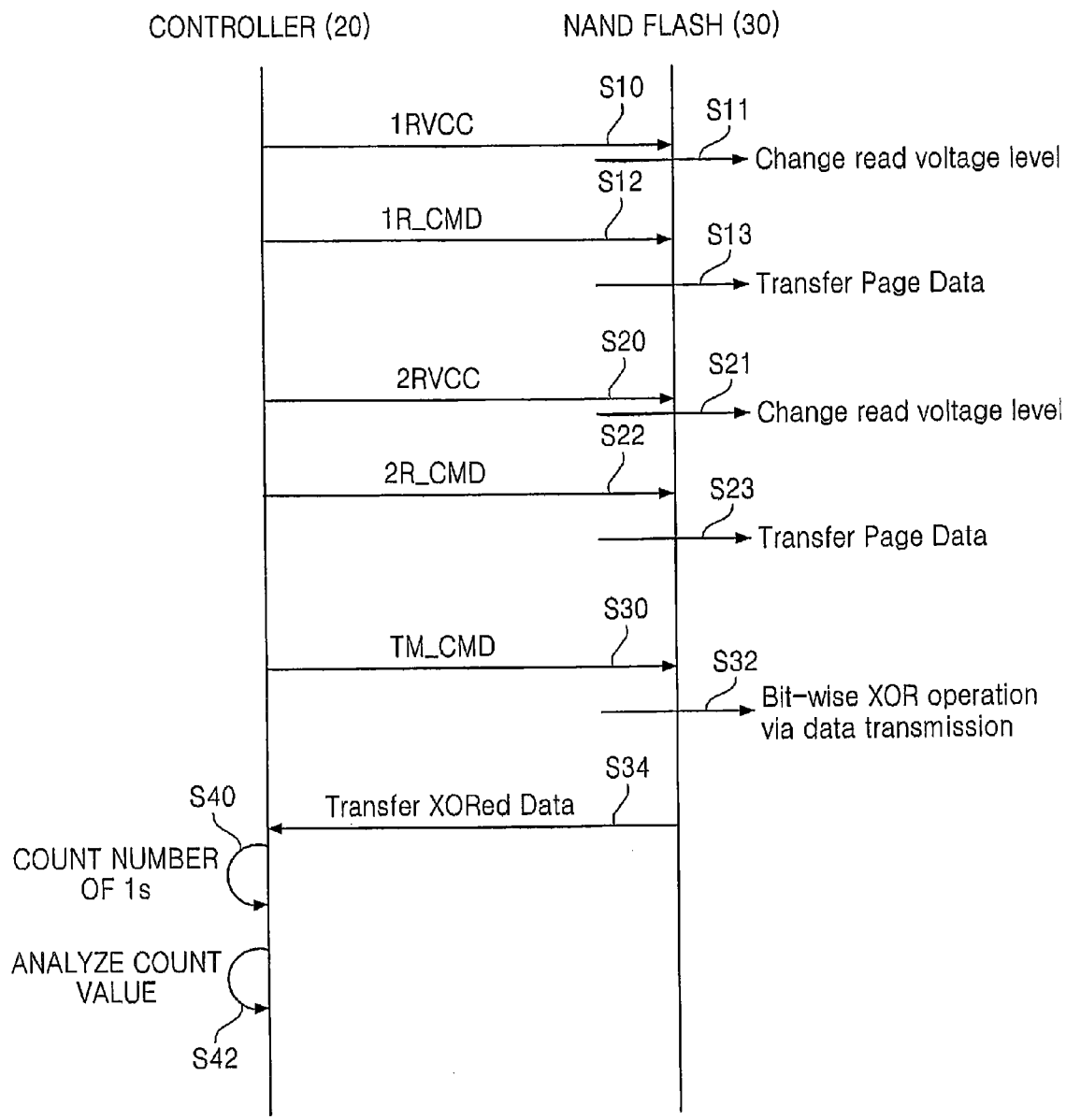
FIG. 2 is a diagram showing commands and a data flow in the operation of the memory system illustrated in FIG. 1.

FIG. 2 is a diagram showing commands and a data flow in the operation of the memory system 10 illustrated in FIG. 1. The operation of the memory system 10 will be described in detail with reference to FIGS. 1 and 2. The command generator 26-1 of the controller 20 outputs a first read voltage level change command 1RVCC to the control logic 50 of the non-volatile memory 30 (S10). The access control circuit 60 changes a first read voltage level to perform a first read operation according to the control of the control logic 50 (S11). The command generator 26-1 outputs a first read command 1R_CMD, e.g., a read command and an address indicating the target page 35, to the control logic 50 (S12). The control logic 50 controls the page buffer block 40 and the access control circuit 60 in response to the first read command 1R_CMD. The access control circuit 60 reads data from the page 35 corresponding to the address using the first read voltage level and transfer first data PD1, which has been read, to the first page buffer 41 through the third page buffer 45 (S13). Alternatively, the first data PD1 may be directly transferred to the first page buffer 41.

The command generator 26-1 outputs a second read voltage level change command 2RVCC to the control logic 50 (S20). The access control circuit 60 changes a second read voltage level to perform a second read operation according to the control of the control logic 50 (S21). The second read voltage level may be higher or lower than the first read voltage level. The command generator 26-1 outputs a second read command 2R_CMD, e.g., a read command and an address indicating the target page 35, to the control logic 50 (S22). The control logic 50 controls the page buffer block 40 and the access control circuit 60 in response to the second read command 2R_CMD. The access control circuit 60 reads data from the page 35 corresponding to the address using the second read voltage level and transfer second data PD2, which has been read, to the second page buffer 43 through the third page buffer 45 (S23). Alternatively, the second data PD2 may be directly transferred to the second page buffer 43. The command generator 26-1 outputs a test mode command TM_CMD to the control logic 50 (S30). The control logic 50 outputs a control signal for controlling each of the page buffers 41, 43, and 45 in response to the test mode command TM_CMD. The operation of each of the page buffers 41, 43, and 45 will be described in detail with reference to FIG. 3A or 3B or FIG. 4.

Figure 3A:
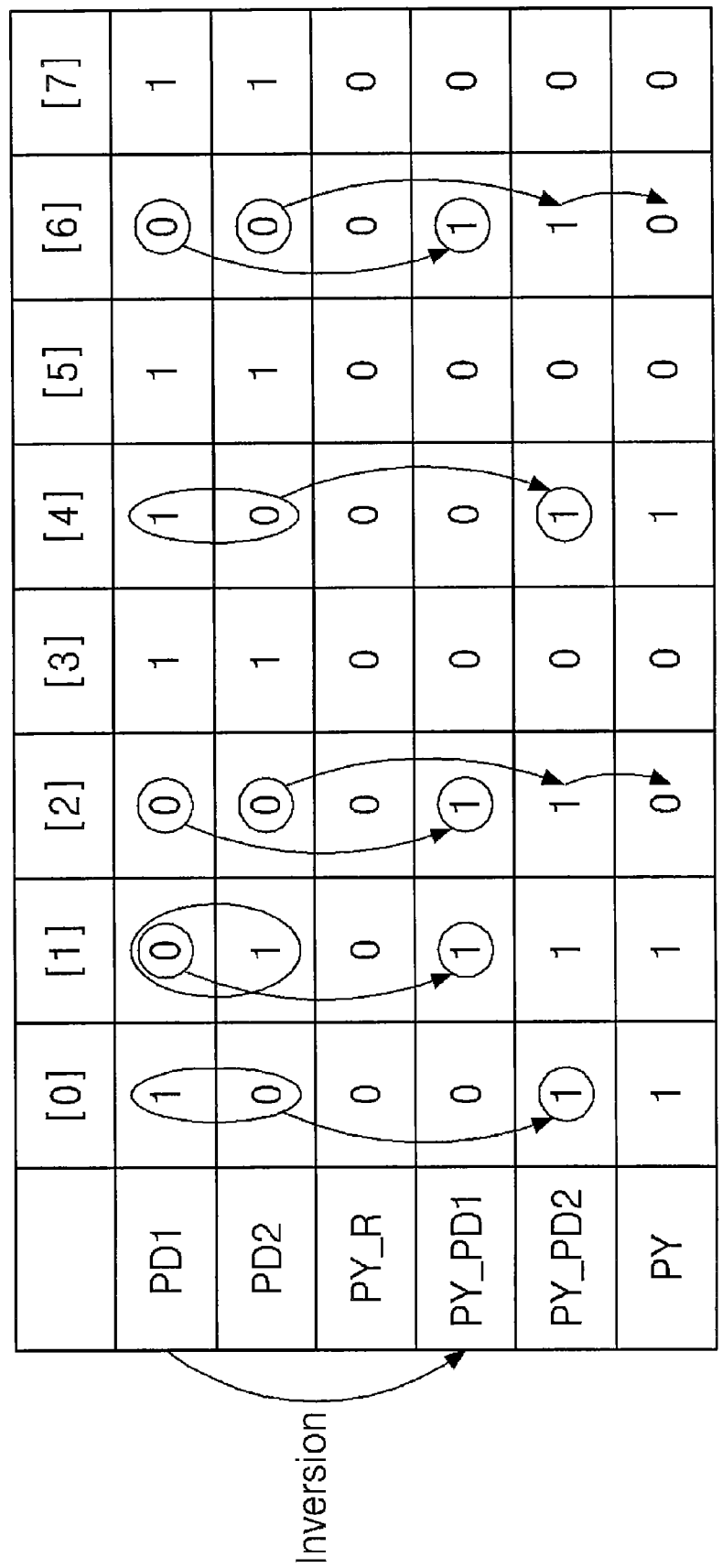
FIG. 3A is a diagram showing a result of bit-wise XOR operation using the transfer of data stored in page buffers according to some embodiments of the inventive concept.

FIG. 3A is a diagram showing a result of bit-wise XOR operation using the transfer of data stored in page buffers according to some embodiments of the inventive concept. It is assumed that the first data PD1 stored in the first page buffer 41 in the first read operation is 8 bits (i.e., PD1[7:0]), e.g., "10011101" and that the second data PD2 stored in the second page buffer 43 in the second read operation is 8 bits (i.e., PD2[7:0]), e.g., "01010101". For clarity of the description, data stored in the target page 35 is read two times using two different read voltage levels, respectively.

It is assumed that data in the third page buffer 45 is initialized to "00000000" in response to a control signal output from the control logic 50. According to embodiments, the command generator 26-1 may transmit command for initializing the data of the third page buffer 45 to the control logic 50. Initial data PY_R (=00000000) in the third page buffer 45 is changed depending on a first group of bits, which are at least part of the first data PD1, i.e., which are included in the first data PD1 and have a first value, e.g., "0".

A second bit [1], a third bit [2], and a seventh bit [6] have the value "0" in the first data PD1, and therefore, the initial data PY_R "00000000" stored in the third page buffer 45 is changed into a first changed data PY_PD1 "01100010".

The first page buffer 41 may change the first data PD1 "10011101" to the first changed data PY_PD1 "01100010" in response to a control signal output from the control logic 50 and transfer the first changed data PY_PD1 "01100010" to the third page buffer 45, so that the initial data PY_R "00000000" in the third page buffer 45 is changed to the first changed data PY_PD1 "01100010".

Alternatively, the first page buffer 41 may transfer the first data PD1 "10011101" to the third page buffer 45 in response to a control signal output from the control logic 50 and the third page buffer 45 may change the initial data PY_R "00000000" to the first changed data PY_PD1 "01100010" in response to a control signal output from the control logic 50.

The first changed data PY_PD1 "01100010" in the third page buffer 45 is changed depending on a second group of bits, which are at least part of the second data PD2, i.e., which are included in the second data PD2 and have the first value "0". A first bit [0], a third bit [2], a fifth bit [4], and a seventh bit [6] have the value "0" in the second data PD2, and therefore, the first changed data PY_PD1 "01100010" stored in the third page buffer 45 is changed into a second changed data PY_PD2 "11101010".

The second page buffer 43 may change the second data PD2 "01010101" to the second changed data PY_PD2 "11101010" in response to a control signal output from the control logic 50 and transfer the second changed data PY_PD2 "11101010" to the third page buffer 45, so that the first changed data PY_PD1 "01100010" in the third page buffer 45 is changed to the second changed data PY_PD2 "11101010".

Alternatively, the second page buffer 43 may transfer the second data PD2 "01010101" to the third page buffer 45 in response to a control signal output from the control logic 50 and the third page buffer 45 may change the first changed data PY_PD1 "01100010" to the second changed data PY_PD2 "11101010" in response to a control signal output from the control logic 50.

The third page buffer 45 may change the value of a common bit among all bits in the second changed data PY_PD2 "11101010" into the first value "0" in response to a control signal output from the control logic 50.

The common bit is a bit corresponding to bits, which have the first value "0" at the same position in both of the first group and the second group. In other words, the third bit [2] in the first data PD1 and the third bit [2] in the second data PD2 have the value "0" and the seventh bit [6] in the first data PD1 and the seventh bit [6] in the second data PD2 have the value "0". Accordingly, the third page buffer 45 changes the second changed data PY_PD2 "11101010" to final data PY "11001000" in response to the control signal output from the control logic 50. The final data PY "11001000" is the same as XOR data, i.e., a result of performing a bit-wise XOR operation on the first data PD1 "10011101" and the second data PD2 "01010101".

The non-volatile memory 30 may output a result of performing an XOR operation on the first and second data PD1 and PD2 without including a separate XOR logic circuit for performing a bit-wise XOR operation on the first and second data PD1 and PD2. According to embodiments, a first operation of initializing the data in the third page buffer 45, a second operation of changing the initialized data PY_R to the first changed data PY_PD1, a third operation of changing the first changed data PY_PD1 to the second changed data PY_PD2, and a fourth operation of changing the second changed data PY_PD2 to the final data PY may be sequentially performed in response to a single test mode command TM_CMD output from the command generator 26-1 of the controller 20.

In this case, the test mode command TM_CMD may be implemented by a packet. Accordingly, the page buffer block 40 may sequentially perform the first through fourth operations based on the control of the control logic 50 that operates in response to the test mode command TM_CMD. Alternatively, the command generator 26-1 of the controller 20 may output four test mode commands TM_CMD to the control logic 50 to independently control the first through fourth operations, respectively. Accordingly, the page buffer block 40 may perform the first through fourth operations in response to the respective test mode commands TM_CMD according to the control of the control logic 50.

FIG. 3B is a diagram showing a result of bit-wise XOR operation using the transfer of data stored in page buffers according to other embodiments of the inventive concept. Referring to FIGS. 1 and 3B, it may happen that data "1" in the first data PD1 read in response to a first read command may be changed to data "0" in the second data PD2 read in response to a second read command. In other words, a first bit [0] and a fifth bit [4] are changed from "1" to "0" in FIG. 3B. Accordingly, it is necessary to keep the value of a bit that has been read "1" in a read operation. Accordingly, when the first data PD1 is "10011101" and the second data PD2 is "01010101", the second page buffer 43 forcibly changes "01010101" to "11011101" according to the control of the control logic 50.

As has been described with reference to FIG. 3A, when initial data PY_R is "00000000", the initial data PY_R "00000000" is changed to first changed data PY_PD1 "01100010" depending on data "0" in the first data PD1 "10011101". Thereafter, the first changed data PY_PD1 "01100010" is changed to second changed data PY_PD2 "01100010" depending on data "0" in changed second data PD2' "11011101". Generating the changed second data PD2' may be performed by the second page buffer 43 after operation S23 shown in FIG. 2. Thereafter, data corresponding to the first and fifth bits [0] and [4], which are forcibly changed in the second data PD2, and data corresponding to common bits [2] and [6], which have the value "0" in both of the first and second data PD1 and PD2, in the second changed data PY_PD2 "01100010" are inverted, so that the final data PY "11001000" is generated.

FIG. 4 is a diagram showing a result of bit-wise XOR operation using the transfer of data stored in page buffers according to further embodiments of the inventive concept. It is assumed that the first data PD1 stored in the first page buffer 41 in the first read operation is "00001111" and that the second data PD2 stored in the second page buffer 43 in the second read operation is "00001111". It is assumed that data in the third page buffer 45 is initialized to "00000000" in response to a control signal output from the control logic 50. Initial data PY_R (=00000000) in the third page buffer 45 is changed depending on a first group of bits, which are at least part of the first data PD1, i.e., which are included in the first data PD1 and have a first value, e.g., "0". A first bit [0], a second bit [1], a third bit [2], and a fourth bit [3] in the first data PD1 have the value "0", and therefore, the initial data PY_R "00000000" stored in the third page buffer 45 is changed into a first changed data PY_PD1 "11110000".

According to embodiments, the first page buffer 41 may change the first data PD1 "00001111" to the first changed data PY_PD1 "11110000" in response to a control signal output from the control logic 50 and transfer the first changed data PY_PD1 "11110000" to the third page buffer 45, so that the initial data PY_R "00000000" in the third page buffer 45 is changed to the first changed data PY_PD1 "11110000". Alternatively, the first page buffer 41 may transfer the first data PD1 "00001111" to the third page buffer 45 in response to a control signal output from the control logic 50 and the third page buffer 45 may change the initial data PY_R "00000000" to the first changed data PY_PD1 "11110000" in response to a control signal output from the control logic 50. The first changed data PY_PD1 "11110000" in the third page buffer 45 is changed depending on a second group of bits, which are at least part of the second data PD2, i.e., which are included in the second data PD2 and have the first value "0". A first bit [0], a second bit [1], a third bit [2], and a fourth bit [3] in the second data PD2 have the value "0", and therefore, the first changed data PY_PD1 "11110000" stored in the third page buffer 45 is maintained as a second changed data PY_PD2 "11110000". The third page buffer 45 may change the value of a common bit among all bits in the second changed data PY_PD2 "11110000" into the first value "0" based on a control signal output from the control logic 50. In other words, the first through fourth bits [0] through [3] in the first data PD1 and the first through fourth bits [0] through [3] in the second data PD2 have the value "0". Accordingly, the third page buffer 45 changes the second changed data PY_PD2 "11110000" to final data PY "00000000" in response to the control signal output from the control logic 50.

The final data PY "00000000" is the same as XOR data, i.e., a result of performing a bit-wise XOR operation on the first data PD1 "00001111" and the second data PD2 "00001111". As described above, the page buffer block 40 changes the third data PY_R in the third page buffer 45 using at least part of the first data PD1 transferred from the first page buffer 41 and at least part of the second data PD2 transferred from the second page buffer 46, thereby generating the data PY that is the same as bit-wise XOR data resulting from the XOR operation on the first and second data PD1 and PD2 (S32). The XOR data PY in the third page buffer 45 is transmitted to the counter 26-2 of the controller 20 via the I/O buffer 70 according to the control of the control logic 50 (S34). The counter 26-2 counts the number of 1s in the XOR data PY and transmits the count value CV to the buffer 26-3 (S40). The analysis module 26-4 analyzes the count value CV received from the buffer 26-3 (S43) and transmits the analysis result to the microprocessor 22 or the host that controls the operation of the controller 20.

Figure 5:
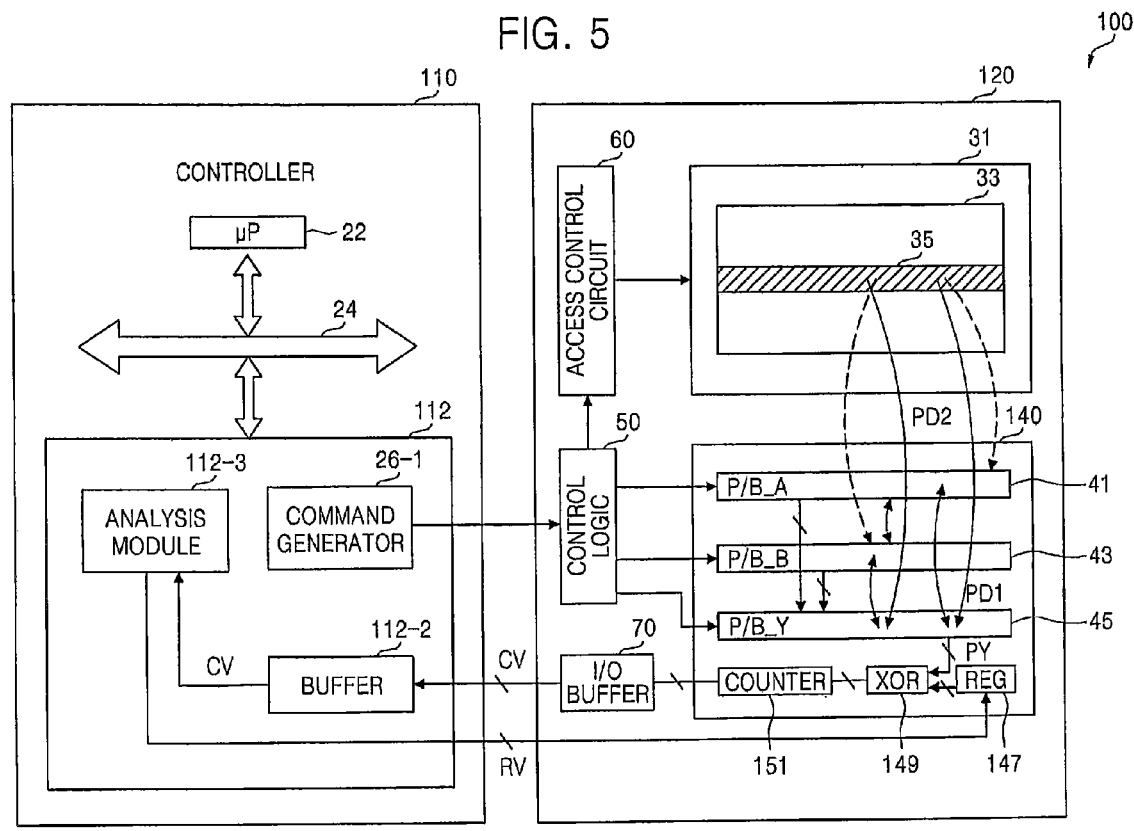
FIG. 5 is a block diagram of a memory system according to other embodiments of the inventive concept.
Figure 6:
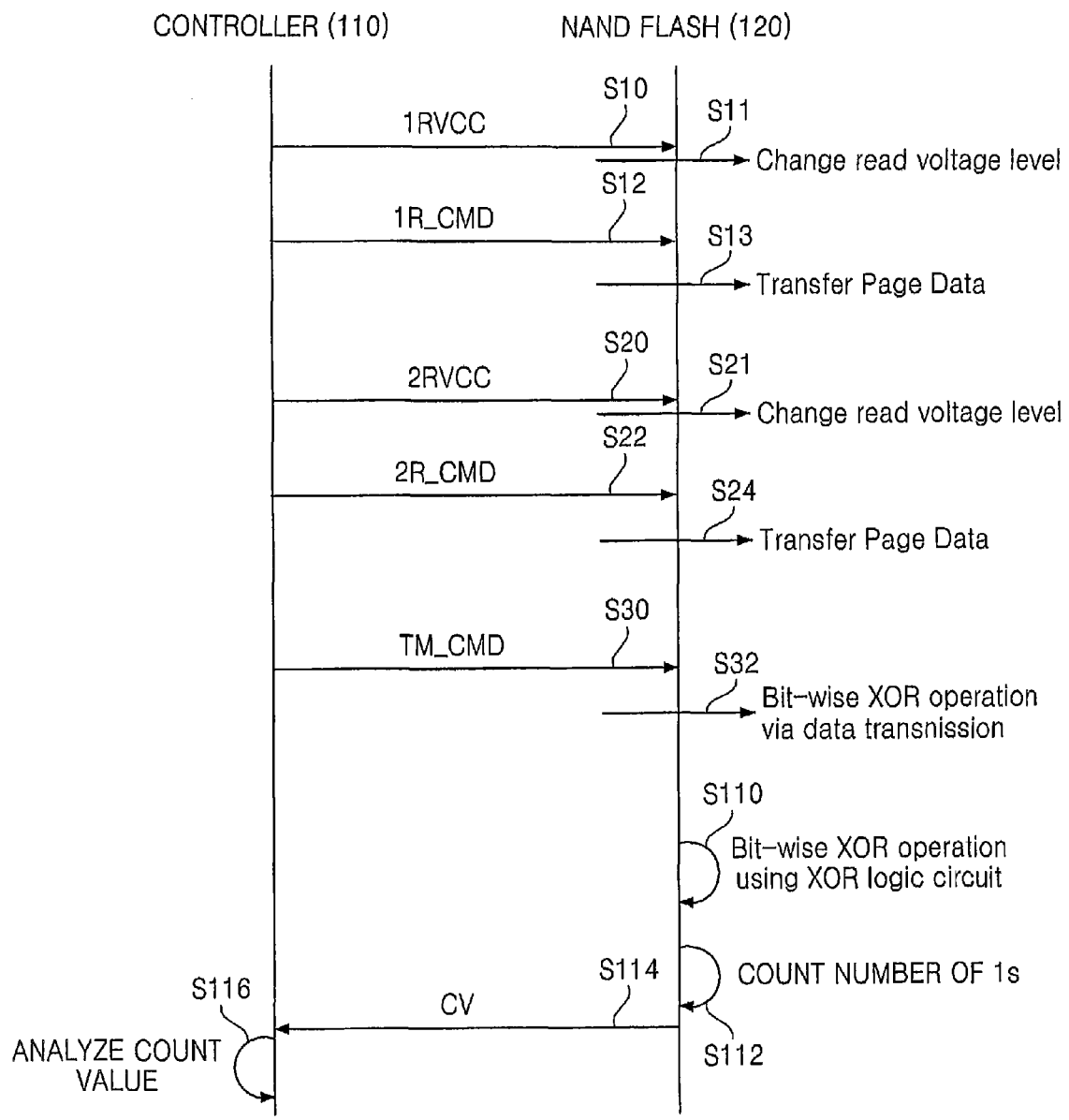
FIG. 6 is a diagram showing commands and a data flow in the operation of the memory system illustrated in FIG. 5.

FIG. 5 is a block diagram of a memory system 100 according to other embodiments of the inventive concept. FIG. 6 is a diagram showing commands and a data flow in the operation of the memory system 100 illustrated in FIG. 5. Operations S10 through S32 in FIG. 2 are the same as operations S10 through 32 in FIG. 6. An analysis module 112-3 transmits reference data RV to a register 147 included in a page buffer block 140. Accordingly, all bits of data stored in the register 147 are initialized to "0" based on the reference data RV.

An XOR logic circuit 149 performs a bit-wise XOR operation on the reference data RV_output from the register 147 and the XOR data PY output from the third page buffer 45 and outputs XOR data corresponding to the result of the XOR operation to a counter 151 (S110). The counter 151 counts the number of 1s in the XOR data received from the XOR logic circuit 149 (S112) and transmits a count value CV to a buffer 112-2 included in a controller 110 through the I/O buffer 70 (S114). The analysis module 112-3 analyzes the count value CV received from the buffer 112-2 (S116) and transmits the analysis result to the microprocessor 22 or the host that controls the operation of the controller 110.

In the embodiments illustrated in FIG. 1, the non-volatile memory 30 outputs the data PY corresponding to the result of performing an XOR operation on the first and second data PD1 and PD2. Then, the controller 20 counts the number of 1s in the XOR data PY and analyzes the count value CV. However, in the embodiments illustrated in FIG. 5, a non-volatile memory 120 generates the data PY corresponding to the result of performing an XOR operation on the first and second data PD1 and PD2, performs an XOR operation on the data PY and the reference data RV, counts the number of 1s in XOR data, and transmits the count value CV to the controller 110. The controller 110 analyzes the count value CV.

Thus, as illustrated and described hereinabove with respect to FIGS. 1-6, nonvolatile memory devices 30 or 120 according to embodiments of the invention respectively include an array of nonvolatile memory cells 33 and a plurality of page buffers 41, 43, . . . , 45 in the read/write path of the nonvolatile memory device. The plurality of page buffers 41, 43, . . . , 45 are configured to receive a corresponding plurality of pages of data (e.g., PD1, PD2) read from the same page of nonvolatile memory cells in the array using different read voltage conditions for each of the plurality of pages of data being read. A control circuit 50 is also provided, which is electrically coupled to the plurality of page buffers 41, 43, . . . , 45. The control circuit 50 is configured to perform a test operation (e.g., to detect excessive threshold-voltage spreading in a page of nonvolatile memory cells) by driving the plurality of page buffers with control signals that cause generation within the nonvolatile memory device of a string of XOR data bits (e.g., PY in FIG. 1), which are derived from a comparison of at least two of the multiple pages of data read from the same page of nonvolatile memory cells using the different read voltage conditions. An input/output device 70 is also provided, which is configured to output test data (e.g., PY, CV) derived from the string of XOR data bits to another device located external to the nonvolatile memory device 30 or 120. According to some of these embodiments of the invention, the input/output device 70 is configured to output the test data to a flash memory controller 20 or 110. This test data may be the string of XOR data bits (see, e.g., FIG. 1) or a count of a number of asserted bits in the string of XOR data bits (see, e.g., FIG. 5).

Figure 7:
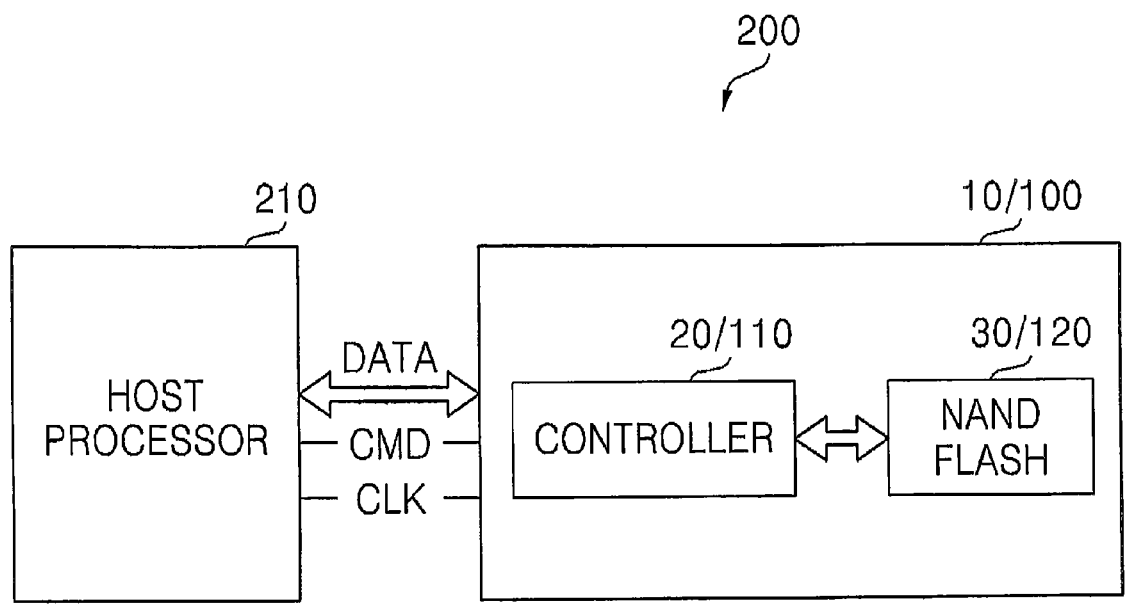
FIG. 7 is a block diagram of an electronic device according to some embodiments of the inventive concept.

FIG. 7 is a block diagram of an electronic device 200 according to some embodiments of the inventive concept. Referring to FIG. 7, the electronic device 200 includes a host processor 210 and the memory system 10 or 100. The electronic device 200 may be implemented as a PC, a laptop computer, or a portable device. A host processor 210 controls the operation of the memory system 10 or 100. The controller 20 and the non-volatile memory 30 illustrated in FIG. 1 may be packaged in a single package, e.g., a multi-chip package (MCP). The controller 110 and the non-volatile memory 120 illustrated in FIG. 5 may also be packaged in the MCP. The host processor 210 and the controller 20 or 110 may communicate data in response to a clock signal CLK and a command CMD. The host processor 210 may function as a driver of the memory system 10 or 100.

Figure 8:
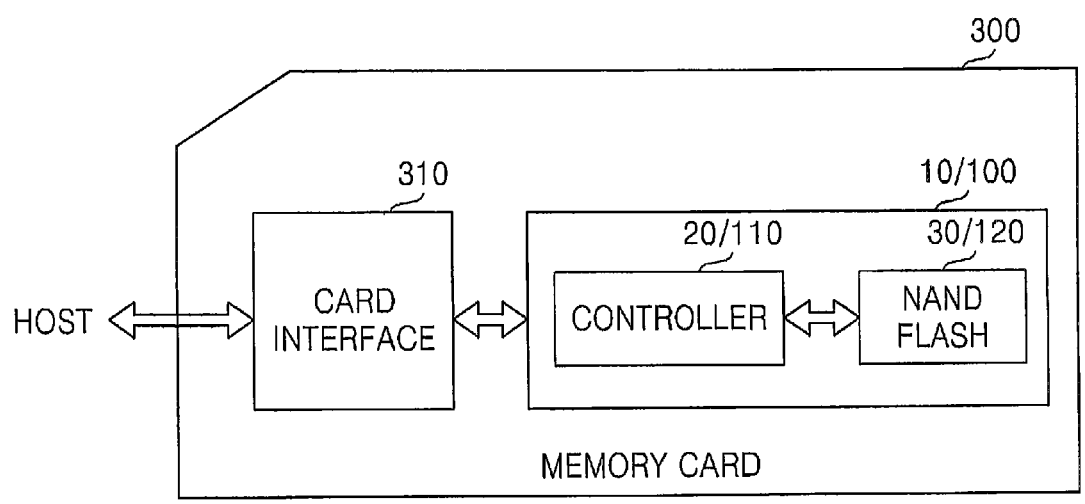
FIG. 8 is a block diagram of an electronic device according to other embodiments of the inventive concept.

FIG. 8 is a block diagram of an electronic device 300 according to other embodiments of the inventive concept. The electronic device 300 may be implemented as a memory card or a smart card, which includes a card interface 310 and the memory system 10 or 100. A host and the memory system 10 or 100 may communicate commands and/or data with each other through the card interface 310. The memory system 10 or 100 may be packaged in the MCP and mounted on a substrate of the memory card 300. The card interface 310 may support a secure digital (SD) card protocol, a multimedia card (MMC) protocol, a universal serial bus (USB) protocol, or an inter-chip USB (IC-USB) protocol.

Figure 9:
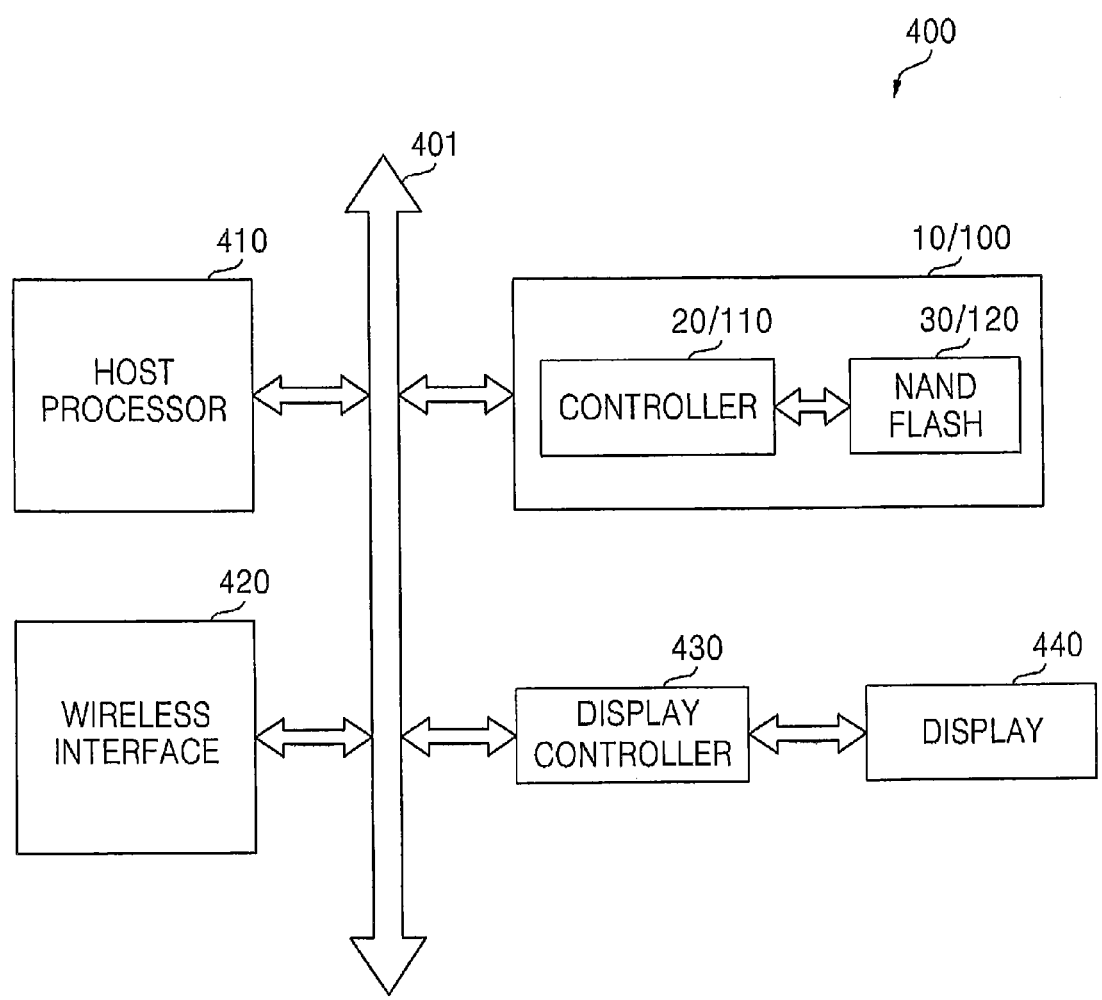
FIG. 9 is a block diagram of an electronic device according to further embodiments of the inventive concept.

FIG. 9 is a block diagram of an electronic device 400 according to further embodiments of the inventive concept. The electronic device 400 may be implemented as a PC, a laptop computer, or a portable device. The electronic device 400 includes the memory system 10 or 100, a bus 401, a host processor 410, a wireless interface 420, a display controller 430, and a display 440. The host processor 410 may communicate commands and/or data with the memory system 10 or 100 through the bus 401. The electronic device 400 may communicate data with external devices through the wireless interface 420 in wireless connection. Data received through the wireless interface 420 may be programmed to the non-volatile memory 30 or 120 through the controller 20 or 110 of the memory system 10 or 100. Data read from the non-volatile memory 30 or 120 may be transmitted to the wireless interface 420 through the controller 20 or 110. The display controller 430 may transmit data from the memory system 10 or 100, the host processor 410 or the wireless interface 420 to the display 440.

Figure 10:
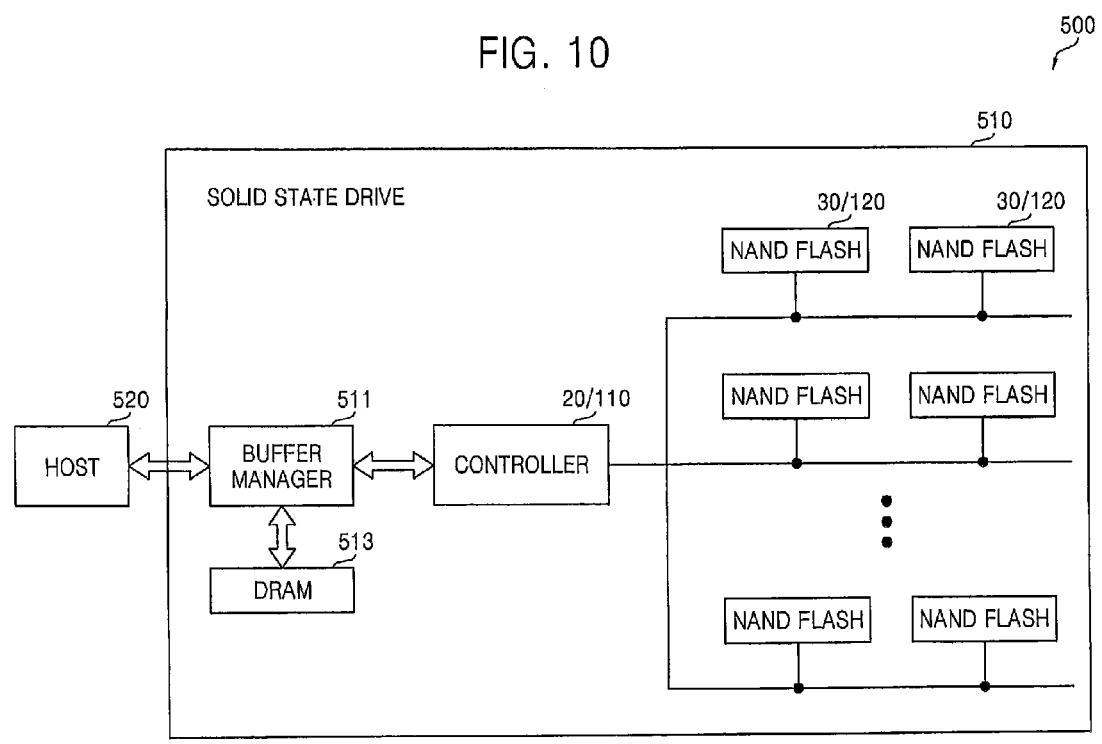
FIG. 10 is a block diagram of an electronic device according to other embodiments of the inventive concept.

FIG. 10 is a block diagram of an electronic device 500 according to other embodiments of the inventive concept. The electronic device 500 includes a data storage device 510 such as a solid state drive and a host 520 that can control the operation of the data storage device 510. The electronic device 500 may be implemented by a PC, a laptop computer, or a portable device. The data storage device 510 includes a plurality of non-volatile memories 30 or 120, the controller 20 or 110 that controls the operation of each of the non-volatile memories 30 or 120, a volatile memory 513 such as a dynamic random access memory (DRAM) or SRAM, and a buffer manager 511 that controls data transmitted between the controller 20 or 110 and the host 520 to be stored in the volatile memory 513.

In the above-described embodiments, an XOR logic circuit has been explained as a bit-wise logic operation, but an exclusive NOR logic circuit may be used instead of the XOR logic circuit. As described above, in a non-volatile memory and a method of operating the same according to some embodiments of the inventive concept, the variation of data stored in a page is quickly measured or calculated using a plurality of data registers implemented in a page buffer. As a result, errors occurring in a read operation can be quickly recovered. In addition, according to the embodiments, a controller does not require buffers for storing data read in different read operations, respectively, and a logic circuit for performing a bit-wise operation on the data output from the buffers. As a result, the layout area and cost for the controller can be reduced.

While the present inventive concept has been particularly shown and described with reference to exemplary embodiments thereof, it will be understood by those of ordinary skill in the art that various changes in forms and details may be made therein without departing from the spirit and scope of the present inventive concept as defined by the following claims.

What is claimed is:

1. A memory system comprising:
a non-volatile memory; and
a controller configured to control an operation of the non-volatile memory,
wherein the non-volatile memory comprises:
a memory cell array comprising a target page;
a first page buffer configured to store first data read from the target page, which is selected according to a first read command output from the controller, using a first read voltage level changed according to a first read voltage level change command output from the controller;
a second page buffer configured to store second data read from the target page, which is selected according to a second read command output from the controller, using a second read voltage level changed according to a second read voltage level change command output from the controller; and
a third page buffer configured to generate data which is the same as bit-wise logical operation data with respect to the first data and second data by changing third data stored therein using at least part of the first data transmitted from the first page buffer and at least part of the second data transmitted from the second page buffer according to a command output from the controller.

2. The memory system of claim 1, wherein the bit-wise logic operation data is bit-wise XOR data or bit-wise exclusive NOR data.

3. The memory system of claim 1, wherein the controller comprises a counter configured to count a number of particular bits in the data the same as the bit-wise logical operation data transmitted from the non-volatile memory.

4. The memory system of claim 3, wherein the particular bits are one of data "0" and data "1".

5. The memory system of claim 1, wherein the non-volatile memory further comprises:
   a logic circuit configured to perform a bit-wise logical operation on reference data transmitted from the controller and the data output from the third page buffer; and
   a counter configured to count a number of particular bits in data output from the logic circuit and to output a count value to the controller.

6. The memory system of claim 5, wherein the logic circuit is an XOR logic circuit and the reference data is stored in a register.

7. The memory system of claim 1, wherein the first data is transferred to the first page buffer through the third page buffer, and the second data is transferred to the second page buffer through the third page buffer.

8. The memory system of claim 7, wherein when the at least part of the first data is a first group of bits, which are included in the first data and have a first value, and the at least part of the second data is a second group of bits, which are included in the second data and have the first value,
   the changing the third data including:
   (a) initializing each value of bits included in the third data to the first value;
   (b) changing each value of bits corresponding to the first group among bits included in the third data, which has been initialized in operation (a), to a second value;
   (c) changing each value of bits corresponding to the second group among bits included in the third data, which has been changed in operation (b), to the second value; and
   (d) changing each value of common bits among bits comprised in the third data, which has been changed in operation (c), to the first value, and
   each of the common bit is a bit corresponding to bits that have the first value at the same position in both of the first group and the second group.

9. The memory system of claim 8, wherein the first value is one of "0" and "1" and the second value is the other one of the "0" and the "1".

10. The memory system of claim 1, wherein the non-volatile memory and the controller are packaged into a single package.

11. The memory system of claim 1, wherein the non-volatile memory is a two-dimensional or three-dimensional NAND flash memory.

* * * * *